United States Patent [19]

Kuehnert

[11] Patent Number: 4,672,872
[45] Date of Patent: Jun. 16, 1987

[54] CUTTING DEVICE WITH A HEATED CUTTING WIRE

[75] Inventor: Egbert Kuehnert, Erzhausen, Fed. Rep. of Germany

[73] Assignee: Hoechst Aktiengesellschaft, Frankfurt am Main, Fed. Rep. of Germany

[21] Appl. No.: 791,328

[22] Filed: Oct. 25, 1985

[30] Foreign Application Priority Data

Oct. 27, 1984 [DE] Fed. Rep. of Germany ....... 3439455

[51] Int. Cl.⁴ .............................................. B26D 7/10
[52] U.S. Cl. .......................................... 83/171; 83/16; 83/651.1
[58] Field of Search .......................... 83/16, 171, 651.1

[56] References Cited

U.S. PATENT DOCUMENTS

| | | | |
|---|---|---|---|
| 3,830,123 | 8/1974 | Wilgus | 83/651.1 X |
| 4,017,012 | 4/1977 | Brock | 83/171 X |
| 4,074,508 | 2/1978 | Reid | 83/171 X |
| 4,077,301 | 3/1978 | Brahm | 83/651.1 X |
| 4,430,718 | 2/1984 | Hendren | 83/651.1 X |

FOREIGN PATENT DOCUMENTS 3420429 12/1985 Fed. Rep. of Germany .

Primary Examiner—Donald R. Schran
Attorney, Agent, or Firm—Schwartz, Jeffery, Schwaab, Mack, Blumenthal & Evans

[57] ABSTRACT

Disclosed is a cutting device which is horizontally displaceable by means of double-acting guide cylinders and is vertically movable along vertical guide rods by means of a positioning device 10. Before cutting, the cutting device is brought into the preselected position by the positioning device. The heated cutting wire of the cutting device is connected to a current source via sliding contacts resting against ball bearings, over which the cutting wire is guided. The circuit of the current source contains a microswitch, the switch lug of which comes to rest against a plate during the forward movement of the cutting device and switches over the microswitch, thus terminating the heating of the cutting wire. This takes place at the moment when a cutting wire, after cutting through a material guided vertically over a cutting bar, penetrates into a notch in the cutting bar.

5 Claims, 1 Drawing Figure

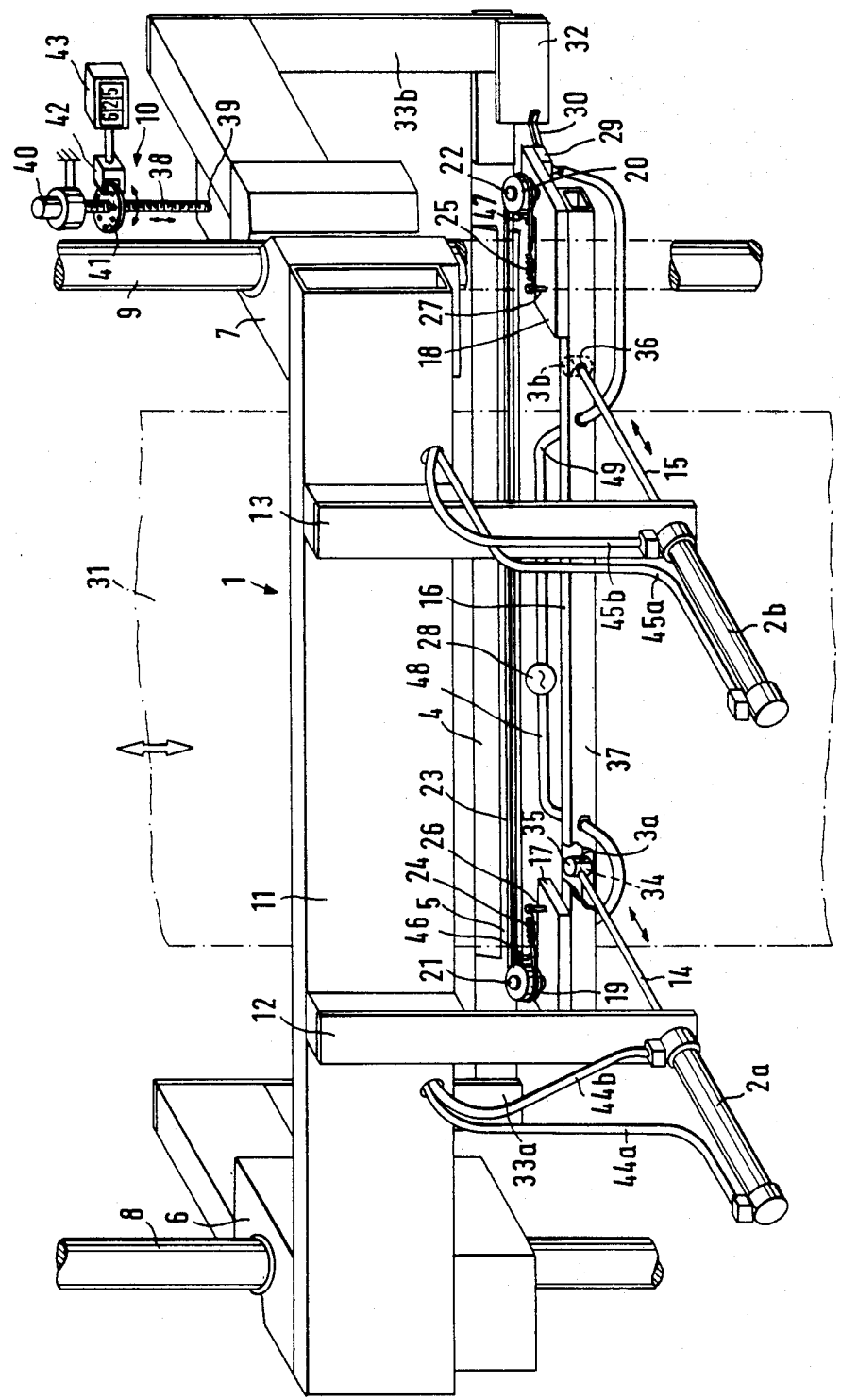

CUTTING DEVICE WITH A HEATED CUTTING WIRE

BACKGROUND OF THE INVENTION

The present invention relates to a cutting device with a heated cutting wire which can be brought into and out of contact with the material to be cut. The invention also relates to a process for cutting material employing the cutting device.

Before lamination carriers, such as printed circuit boards, multilayer laminations, metal plates or substrates with metal layers evaporated and/or glued on both sides, are laminated with a photoresist film, the latter is stretched free of folds on horizontally or vertically aligned suction plates of vacuum tables. The photoresist film is then cut to the desired size required to ensure that the film is laminated on the particular lamination carrier with perfect matching.

The laid-open European Patent Applications Nos. 40,842, 40,843 and 41,642 disclose laminating devices in which a substrate or a lamination carrier is laminated on both sides with a dry resist by the exertion of pressure. The dry resist for the particular side of the lamination carrier, for example, a printed circuit board, to be laminated, is drawn off a supply roll and fed to a pair of laminating rollers. The two dry resist films and the lamination carrier located between them are then passed through the nip of the rollers.

German Patent Application No. P 34 20 429.6 describes a cutting device for cutting dry resist films. The device incorporates a rotary knife, the height of which is adjustable and which can be moved over vacuum tables which are vertically arranged. As soon as the rotary knife has reached its predetermined height, it is moved transversely over the vacuum table in order to cut through the dry resist film stretched on the suction plate of the vacuum table. The rotary knife is arranged on a knife carrier mounted pivotally on guides which are displaceable along the vertical guide rods on both sides of the vacuum tables. A cross-member connects the two guides and is equipped with struts, to which is fastened a rail extending transversely relative to the photoresist film and having a cutting edge. The cross-member can be clamped in the desired position on the guide rods by means of a clamping piece. A gear intended for the knife drive and engaged with the rack is driven by a motor and is moved over the width of the photoresist film. The gear causes the rotary knife to rotate and moves it along the cutting edge of the rail, over the photoresist film, during the cutting operation. Cutting takes place mechanically so that the rotary knife always has to be ground sharp to prevent the photoresist film from splintering off along the cut edge, which occurs when the rotary knife is blunt. The movement of the rotary knife transversely over the photoresist during cutting is relatively slow in comparison with the cutting device which is also described in this German patent application and which operates with a heated cutting wire instead of a rotary knife. The latter cutting device is pivotal about a pivot axle which is actuated by a motor. The pivot axle is mounted in guides which can be fixed in a preselectable position along guide rods by a positioning device. A bearing arm is mounted on each of two bearing blocks resting on the pivot axle. The bearing arms are connected at their other ends to a carrier for the cutting wire. For the cutting operation, the carrier is pivoted by means of the motor in a circular path in the direction of the supporting rail for the photoresist film. The cutting wire, when it penetrates into the slot in the supporting rail, severs the photoresist film resting on the supporting rail. Because the cutting wire is positioned vertically, the problem arises that the preselected position of the cutting wire, which, for example, is fixed by means of a positioning device, only indirectly indicates the actual cutting point, and thus the dimensions of the cut-to-size photoresist film. The cutting wire does not execute a linear movement, but instead, an arcuate movement towards the photoresist film.

SUMMARY OF THE INVENTION

It is therefore an object of the present invention to provide a cutting device for photoresist films, which has a simple construction and can be brought into the pre-selected position and can execute a cut over short distances.

Another object of the present invention is to provide a cutting device in which the preselected position directly indicates the cutting point on the photoresist film.

In accomplishing the foregoing objects, there has been provided in accordance with one aspect of the present invention, a cutting device, comprising a heated cutting wire engagable with a material to be cut, at least two guides, at least two double-acting guide cylinders fastened to the guides for horizontally displacing the cutting device, at least two vertical guide rods, and a positioning device for positioning the guides vertically along the guide rods. In a further embodiment, the device additionally comprises a first rectangular tube connecting the guides, at least two vertical struts attached to the first rectangular tube, a second rectangular tube positioned below the first rectangular tube, and means for mounting the guide cylinders to the second rectangular tube, wherein the guide cylinders are attached to the vertical struts and each of said guide cylinders comprises a piston rod which extends through the vertical struts and is mounted by the mounting means to the second rectangular tube.

In accordance with another aspect of the present invention, there has also been provided a process for cutting a material, comprising the steps of vertically passing a material through a cutting device comprising a horizontal extending cutting wire, vertically positioning the cutting wire at a predetermined height, electrically heating the cutting wire, horizontally passing the heated cutting wire into cutting engagement with and through the material to be cut, disconnecting the electrical circuit to the electrically heated cutting wire, and retracting the cutting wire.

The invention achieves the advantage that the cutting device executes only vertical and horizontal linear movements. Such movements are time-saving. Furthermore, when the position of the cutting device is digitally preselected, the latter is brought along the vertical guide rods into a position located at the same height as the cutting point, so that there is a direct relation between the pre-selected position of the cutting device and the cutting point. Thus, the dimension of the photoresist film to be laminated is given.

Further objects, features and advantages of the present invention will become apparent from a review of the detailed description of a preferred embodiment which follows, when considered with the attached figure of drawing.

BRIEF DESCRIPTION OF THE DRAWING

In the drawing:

The FIGURE illustrates the present device in a perspective view.

DETAILED DESCRIPTION OF PREFERRED EMBODIMENTS

The objects of the present invention are achieved by a cutting device which is horizontally displaceable by means of double-acting guide cylinders. Additionally, the cutting device is fastened to guides which are movable up and down by means of a positioning device along vertical guide rods.

In an embodiment of the invention, the cutting device has a first rectangular tube which connects the guides to one another and to which two vertical struts are attached. Each vertical strut retains on one side, one of the guide cylinders, the piston rods of which pass through the vertical struts and are mounted by means of their ends in joints arranged in a second rectangular tube underneath the first rectangular tube.

The single FIGURE illustrates, in the perspective view, a cutting device 1 having a heated cutting wire 23 for cutting a material 31, for example, a photoresist film. A support in the form of a first rectangular tube 11 connects guides 6 and 7 to one another. The guide rods 6 and 7 are displaceable up and down along vertical guide rods 8 and 9, and can be fixed in a pre-determined position. The position of the first rectangular tube 11 or of the guides 6 and 7 is fixed by a positioning device 10 which will be described in more detail below. Attached to the first rectangular tube 11 are two vertical struts 12 and 13. The lower ends of the vertical struts are located approximately at the height of a further support in the form of a second rectangular tube 16. A guide cylinder 2a, 2b is fastened to the front side of each vertical strut 12, 13, respectively. The guide cylinders 2a and 2b are, for example, double-acting pneumatic or hydraulic cylinders which are subjected to the particular operating medium via delivery lines 44a, 44b and 45a, 45b, respectively. Piston rods 14 and 15 of the horizontally aligned guide cylinders 2a, 2b pass through the vertical struts 12 and 13 and are mounted by means of their ends in joints 3a and 3b, of which the joint 3a is shown in segmental, cut-away form inside the exposed portion of the second rectangular tube 16, while the other joint 3b is indicated by broken lines. Each of the joints 3a, 3b comprises a cylinder which is fitted into the second rectangular tube 16, the bottom surface 34 and top surface 35 of which rests against the lower and upper inner surfaces, respectively, of the rectangular tube 16. The piston rods 14 and 15 have threads (not shown) which are screwed into threaded bores in the joints 3a and 3b. As can be seen by reference to the piston rod 15 on the right, the rod passes through a front surface 37 of the second rectangular tube 16 inside a circular duct 36 having a diameter slightly greater than the diameter of the piston rod. The same also applies to the piston rod 14 on the left. The play between the piston rods 14 and 15 and their ducts in the front surface 37 of the second rectangular tube 16 ensures that slight differences in the positions of the piston rods 14, 15, when they are extended or retracted, can be compensated without the second rectangular tube 16 tilting during its horizontal forward or reverse movement.

Fastening plates 17 and 18 are attached horizontally to the top surface of the second rectangular tube 16 near its ends. Each of these fastening plates 17 and 18 is provided with a ball bearing 19, 20 which is rotatable about a vertical ball-bearing axle 21, 22. The cutting wire 23 is guided around the two grooved ball bearings 19 and 20, and its ends are connected to springs 24 and 25 which are retained in pins 26 and 27 on the fastening plates 17 and 18 in order to tension the cutting wire 23. The cutting wire 23 is heated by means of a current source 28 which is connected via cables 48 and 49 to a sliding contact 46 resting against the left-hand ball bearing 19 and to a microswitch 29 on the underside of the right-hand fastening plate 18. The current source 28 can be an alternating-current or a direct-current source. The cable 48 connects one pole of the current source 28 to the sliding contact 46. The second pole of the current source 28 is guided via the cable 49 to a connection side of the microswitch 29. The other connection side of the microswitch 29 is connected to the sliding contact 47. The sliding contacts 46 and 47 are connected to the cutting wire 23 via the ball bearings 19 and 20.

A horizontal cutting bar 4 having a notch 5 is fastened to frame parts 33a and 33b which are in turn connected to the guides 6 and 7. The cutting wire 23 and the notch 5 are at the same height. Arranged on the front side of the right-hand frame part 33b is a plate 32, against which a switch lug 30 of the microswitch 29 comes to rest when the cutting device 1 or the cutting wire 23 moves forward in the direction of the cutting bar 4. At the same time as when the cutting wire 23 penetrates into the notch 5 of the cutting bar 4 after cutting through the material 31, preferably a photoresist film, being guided vertically over the cutting bar 4, the switch lug 30 is pressed against the plate 32 and the microswitch 29 is switched over so that it breaks the electrical connection between the current source 28 and the cutting wire 23, as a result of which the latter cools due to lack of current. This ensures that, when the cutting wire is retracted horizontally out of the notch 5, the cut edges of the photoresist film do not stick to the cutting wire which, when being retracted, brushes over the cut edge. If the heating current for the cutting wire 23 were not cut off or switched off, the latter, when retracted into its initial position, would be hot enough for the photoresist film possibly to stick to the cutting wire as it passes the cut edge.

The positioning device 10 for the cutting device 1 corresponds essentially to the positioning device proposed in German Patent Application No. P 34 20 429.6 and comprises a spindle 38 engaged with a spindle nut 39 which is arranged on the rear side of the right-hand guide 7. Of course, the positioning device 10 can also be attached to the left-hand guide 6. A perforated or slotted disk 41 is fastened to the spindle 38. The edge of the disk projects into a light barrier 42. A spindle motor 40 causes the spindle 38 to rotate in the clockwise or anticlockwise direction, depending on whether the cutting device 1 is to be moved up or down. During a complete revolution of the spindle or during each complete passage of the perforated or slotted disk 41 through the light barrier 42, the latter generates a pulse which is displayed in a digital counter 43 connected to the light barrier. The pitch of the spindle 38 is selected, for example, so that a vertical shift of the cutting device 1 one millimeter along the guide rods 8 and 9 upwards or downwards corresponds to a complete revolution of the spindle 38. The numerical reading of the digital counter 43 then indicates the particular position of the cutting device, that is to say, the distance in millimeters from an initial or starting position of the cutting device. Since the cutting wire 23 and the notch 5 of the cutting bar 4 are at the same height before the cut, there is a direct relation between the position of the cutting device and the blank size of the material 31. At the start of each new positioning operation, the cutting device 1 is automatically moved into its starting position, from which it can then travel towards the newly pre-selected position.

What is claimed is:

1. A cutting device, comprising:
   (a) at least two vertically disposed guide rods;
   (b) a guide connected to each of said guide rods, said guide vertically moveable along said guide rod by a positioning device;
   (c) a first rectangular tube connecting said guides;
   (d) at least two vertical struts attached to said first rectangular tube;
   (e) a double-acting guide cylinder fastened to each of said vertical struts, said guide cylinder comprising a piston rod which extends through said vertical strut and is mounted to a second rectangular tube positioned below said first rectangular tube;
   (f) means for mounting said guide cylinder to said second rectangular tube;
   (g) a horizontal fastening plate attached to each end of said second rectangular tube;
   (h) a rotatable ball bearing attached to each of said fastening plates;
   (i) a horizontally disposed heated cutting wire suspended between and guided by said rotatable ball bearings; and
   (j) means attached to each of said fastening plates for tensioning said cutting wire, said tensioning means comprising a pin retained on each of said fastening plates and a spring attaching said pin to an end of said cutting wire.

2. A cutting device as claimed in claim 1, further comprising:
   a plate;
   a microswitch which includes a switch lug; and
   a current source in series with said microswitch, wherein said switch lug engages said plate during horizontal forward movement of said cutting device to actuate said microswitch to cut off said current source.

3. A cutting device as claimed in claim 2, further comprising:
   a frame part connected to each of said guides; and
   a cutting bar below said first rectangular tube comprising a notch connected at each end to one of said frame parts, wherein said switch lug is actuated upon the penetration of said cutting wire into said notch to break the connection between said current source and said cutting wire.

4. A cutting device as claimed in claim 1, wherein said guide cylinder mounting means comprises a cylinder housed in said second rectangular tube which includes a threaded portion for receiving said said guide cylinder piston rod, and wherein said second rectangular tube includes at least two circular ducts through which said piston rods extend, the diameter of said ducts being slightly larger than the diameter of said piston rods to allow for movement of said second rectangular tube in relation to said piston rods.

5. A cutting device as claimed in claim 1, wherein said positioning device comprises:
   a spindle;
   a spindle nut engaged with said spindle and fastened to one of said guides;
   a spindle motor for rotating said spindle;
   a light barrier;
   a perforated disk, the end of said disk projecting into said light barrier; and
   a digital counter connected to said light barrier.

* * * * *